(12) United States Patent
Takagi et al.

(10) Patent No.: US 7,070,701 B2
(45) Date of Patent: Jul. 4, 2006

(54) MANUFACTURING METHOD OF FINE STRUCTURE, OPTICAL ELEMENT, INTEGRATED CIRCUIT, AND ELECTRONIC INSTRUMENT

(75) Inventors: Kenichi Takagi, Kuwashiki (JP); Tomohiko Sogo, Shiojiri (JP); Yuji Saito, Suwa (JP)

(73) Assignee: Seiko Epson Corporation (JP)

( * ) Notice: Subject to any disclaimer, the term of this patent is extended or adjusted under 35 U.S.C. 154(b) by 162 days.

(21) Appl. No.: 10/681,819

(22) Filed: Oct. 8, 2003

(65) Prior Publication Data

US 2004/0132294 A1 Jul. 8, 2004

(30) Foreign Application Priority Data

Oct. 8, 2002 (JP) .............................. 2002-294878

(51) Int. Cl.
 B44C 1/22 (2006.01)
(52) U.S. Cl. ............................ 216/41; 216/47; 216/65; 430/5; 430/312; 219/121.61
(58) Field of Classification Search ................. 216/41, 216/47, 65; 430/5, 312; 219/121.61
See application file for complete search history.

(56) References Cited

U.S. PATENT DOCUMENTS

| 5,888,679 | A | * | 3/1999 | Suzuki et al. | ................... | 430/7 |
| 6,042,974 | A | * | 3/2000 | Iwata et al. | ..................... | 430/7 |
| 6,638,439 | B1 | * | 10/2003 | Shimomura | ................... | 216/27 |
| 6,783,208 | B1 | | 8/2004 | Kawase et al. | | |
| 6,936,180 | B1 | * | 8/2005 | Kamijima | ..................... | 216/22 |

| 2003/0010241 | A1 | | 1/2003 | Fujihira et al. | | |
| 2003/0010408 | A1 | * | 1/2003 | Hosoe et al. | ................ | 148/310 |

FOREIGN PATENT DOCUMENTS

| CN | 1366205 A | 8/2002 |
| EP | 0 989 778 A1 | 3/2000 |
| JP | 09-329706 | 12/1997 |
| JP | 10-123500 | 5/1998 |
| JP | 2001-130141 | 5/2001 |
| JP | 2001-281437 | 10/2001 |
| JP | 2001-284274 | 10/2001 |
| JP | 2001-284289 | 10/2001 |
| JP | 2002-221616 | 8/2002 |
| JP | 2002-221617 | 8/2002 |
| JP | 2002-225259 | 8/2002 |
| JP | 2002-250811 | 9/2002 |
| JP | 2002-273869 | 9/2002 |
| JP | 2003-270422 | 9/2003 |
| WO | WO99-48339 A | 9/1999 |
| WO | WO 30/062920 | 7/2003 |

OTHER PUBLICATIONS

Communication from Chinese Patent Office re: related application.

(Continued)

*Primary Examiner*—Shamim Ahmed
(74) *Attorney, Agent, or Firm*—Harness, Dickey & Pierce, P.L.C.

(57) ABSTRACT

A fine structure manufacturing method is provided. The method comprises providing a lyophilic film on a treated surface of a substrate on which a pattern having a desired form is to be formed, providing a liquid-repellent film on an upper surface of the lyophilic film, the liquid-repellent film having liquid repellency relative to a liquid material used for forming the pattern, and eliminating a part of the liquid-repellent film located on an area where the pattern is to be formed.

9 Claims, 11 Drawing Sheets

OTHER PUBLICATIONS

Communiction from Japan Patent Office re: counterpart application.

Communication from Taiwan Patent Office regarding counterpart application.

* cited by examiner

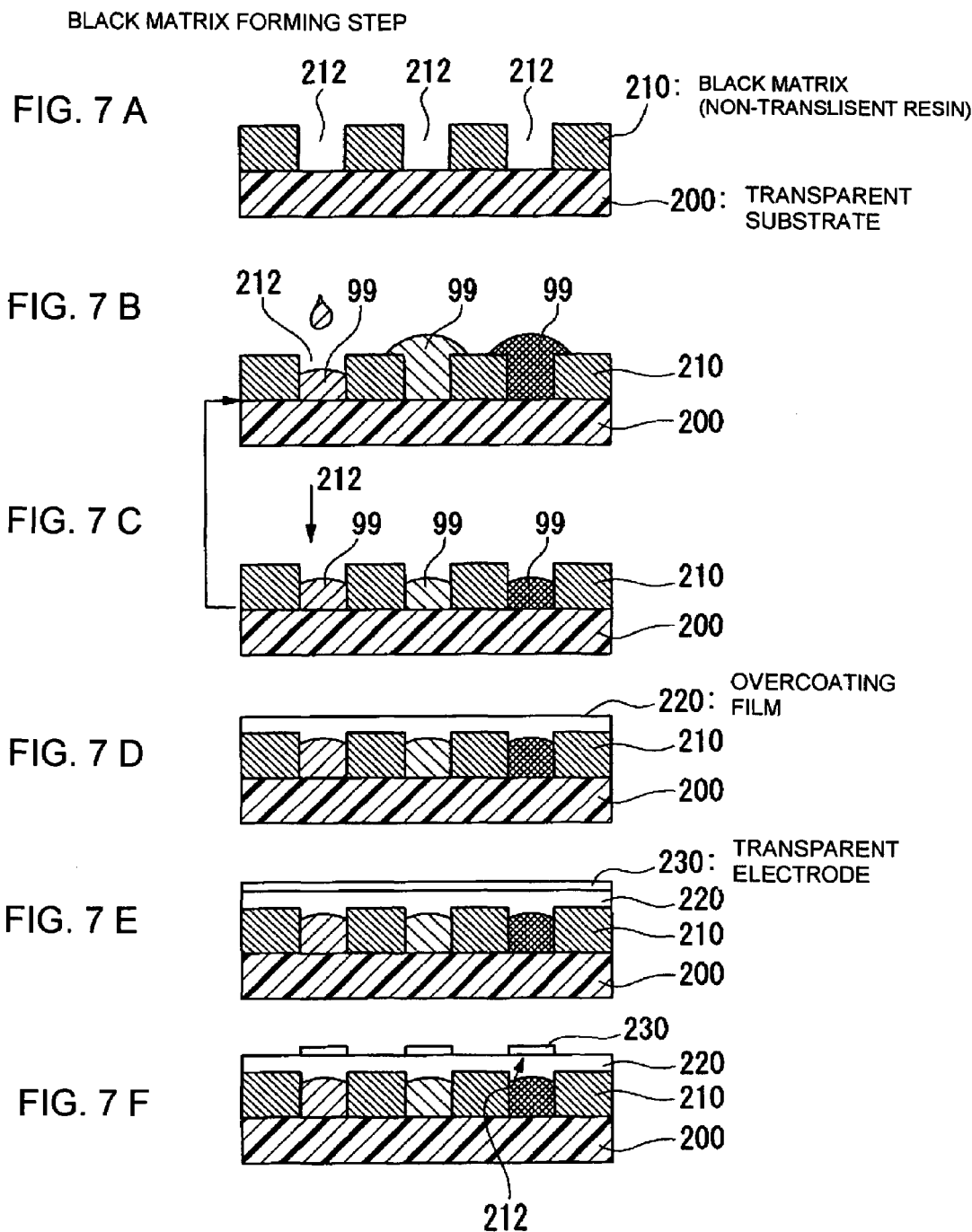

MANUFACTURING METHOD OF FINE STRUCTURE, OPTICAL ELEMENT, INTEGRATED CIRCUIT, AND ELECTRONIC INSTRUMENT

BACKGROUND OF THE INVENTION

1. Field of the Invention

The present invention relates to a fine structure manufacturing method suitable when forming a desired pattern by liquid material, an optical element, an integrated circuit, and an electronic instrument.

2. Related Art

Conventionally, as a method for forming a fine pattern such as pixels of an optical element such as a color filter, or a wiring pattern of a semiconductor integrated circuit, there has been a method for enclosing (filling) liquid material in a desired pattern on a substrate, and then, performing drying and baking thereon. As a method for enclosing liquid material in a desired pattern, a method as described below has been developed. First, with respect to an inner area of the desired pattern, a lyophilic area is formed by performing lyophilic treatment, and with respect to an outer area of the desired pattern, a liquid-repellent (lyophobic) area is formed by performing liquid-repellent treatment. Subsequently, liquid material is filled in the desired pattern by filling liquid material in the lyophilic area surrounded by the liquid-repellent area.

However, in the conventional method for forming fine pattern, liquid-repellent treatment for forming a fluoric film etc. on an entire treated surface of a silicon substrate etc. is performed. Then, only a desired pattern area on the liquid-repellent treated surface is irradiated with an ultraviolet ray etc. As such, the fluoric film of the pattern area is eliminated and organic matter adhered to the area is decomposed and eliminated to turn the area lyophilic. Unfortunately, a problem has occurred in that the treatment for turning the area lyophilic takes a long time.

The cause of the problem is that, once silicon and fluorine are bonded, they becomes stable and the bonding force becomes very strong. Thus, when trying to decompose the bonded silicon and fluorine by ultraviolet irradiation etc., the decomposition takes a long time.

Further, in the above-described conventional method for forming a fine pattern, another problem occurs in that, when forming an optical element such as a color filter on a transparent substrate, the optical characteristics of the transparent substrate may be degraded due to the lyophilic treatment by ultraviolet irradiation.

Furthermore, in the above-described conventional method for forming a fine pattern, yet another problem occurs in that, the treated surface on the substrate is sometimes contaminated. As such, the adhesion between the pattern formed on the substrate and the substrate is not ideal.

The invention is achieved in light of the facts described above, and one object thereof is to provide a fine structure manufacturing method capable of forming a desired pattern at high speed using liquid material, an optical element, an integrated circuit, and an electronic instrument.

SUMMARY

In order to achieve the above-described object, a fine structure manufacturing method of the invention comprises the steps of: providing a first film on a treated surface of a member in which a pattern having a desired form is to be formed by applying liquid material to the member in which a pattern is formed; providing a liquid-repellent film having liquid repellency to the liquid material on an upper surface of the first film; and eliminating the liquid-repellent film in a part of the liquid-repellent film, which corresponds to an area where the pattern is to be formed.

According to the invention, since the first film is provided between the treated surface and the liquid-repellent film, the treated surface and the liquid-repellent film are not bonded. As such, the liquid-repellent film can be easily decomposed and eliminated at high speed. Therefore, according to the invention, a pattern having a desired form can be formed at high speed.

Further, according to the invention, by providing the first film on the treated surface, for example, the treated surface is cleansed and can be prevented from contamination, thereby a desired pattern can be formed.

Furthermore, according to the invention, the treated surface can be prevented from being damaged in the treatment of decomposing and eliminating the liquid-repellent film by the first film.

In addition, in the fine structure manufacturing method of the invention, it is preferred that the first film is a lyophilic film having a lyophilic property relative to the liquid material.

According to the invention, since the first film provided between the treated surface and the liquid-repellent film is a lyophilic film, the decomposition and elimination of the liquid-repellent film can be sped up and the contamination of the treated surface can be prevented, and further, the treated surface can be prevented from being damaged.

Furthermore, in the fine structure manufacturing method of the invention, it is preferred that the first film serves as a sacrificial layer for suppressing damage to the treated surface, when performing the treatment of eliminating the liquid-repellent film.

According to the invention, by providing the sacrificial layer between the treated surface and the liquid-repellent film, for example, the treated surface can be prevented from being damaged in the treatment of decomposing and eliminating the liquid-repellent film. Therefore, for example, in the case where an optical element such as a color filter is provided with one of the surfaces of a transparent substrate as the treated surface, the optical characteristics of the optical element can be prevented from being degraded in the manufacturing process.

Further, in the fine structure manufacturing method of the invention, it is preferred that, after forming a pattern on the treated surface, the first film serves as a sacrificial layer for suppressing at least one of degradation of the pattern and adhesion degradation between the pattern and the treated surface.

According to the invention, by providing the sacrificial layer between the treated surface and the liquid-repellent film, the degradation of the pattern provided on the sacrificial layer can be prevented and the adhesion degradation between the pattern and the treated surface can be suppressed, thereby a structurally and chemically preferable pattern can be formed.

Further, in the fine structure manufacturing method of the invention, it is preferred that the liquid-repellent film is an activated film activated or volatilized by being irradiated with an electromagnetic wave.

According to the invention, for example, a desirably patterned lyophilic area can be formed by irradiating the liquid-repellent film with an ultraviolet ray, a type of electromagnetic wave, to decompose and eliminate the liquid-repellent film.

Further, it is preferred that the fine structure manufacturing method of the invention further comprises a step of eliminating the first film with respect to a part of the first film located on an area in which the pattern is to be formed, after eliminating the liquid-repellent film.

According to the invention, since not only the liquid-repellent film but also the first film is eliminated in the area in which the pattern is formed, when filling liquid material in the eliminated area, a holding force as a force suppressing an overflow of the liquid material from the area can be improved.

Furthermore, in the fine structure manufacturing method of the invention, it is preferred that the elimination of the first film is performed by irradiation with an electromagnetic wave.

According to the invention, a desired pattern having a strong holding force can be easily formed by, for example, irradiating the first film with an ultraviolet ray, a type of electromagnetic wave, to decompose and eliminate the first film.

In addition, a fine structure manufacturing method of the invention comprises the steps of: providing a first film on a treated surface on which a pattern having a desired form is to be formed; providing a liquid-repellent film having liquid repellency to a liquid material serving as a member for forming the pattern on an upper surface of the first film; and eliminating the liquid-repellent film with respect to a boundary part of the area where the pattern is to be formed in the liquid-repellent film.

According to the invention, since the liquid-repellent film is eliminated with respect to the boundary part of the pattern of the liquid-repellent film and not eliminated with respect to the inside of the boundary part of the pattern, the time for elimination can be shortened, and further, the holding force on the liquid material within the pattern can be improved.

Further, it is preferred that the fine structure manufacturing method of the invention further includes a step of eliminating the first film of the boundary part of the area where the pattern is to be formed.

According to the invention, since the liquid-repellent film and the first film are eliminated with respect to the boundary part of the pattern, the holding force on the liquid material within the pattern can be improved.

Furthermore, in the fine structure manufacturing method of the invention, it is preferred that the first film serves as a decomposition acceleration layer accelerating the decomposition of the liquid-repellent film.

According to the invention, the liquid-repellent film can be easily decomposed and eliminated at high speed, thereby shortening the time for manufacturing and reducing manufacturing costs.

In addition, a fine structure manufacturing method of the invention comprises the steps of: providing a lyophilic film having a lyophilic property to a liquid material for forming a pattern on a treated surface of a member in which a pattern having a desired form is to be formed; providing a decomposition acceleration layer accelerating a decomposition of a liquid-repellent film having liquid repellency relative to the liquid material on an upper surface of the lyophilic film; providing the liquid-repellent film having liquid repellency relative to the liquid material on an upper surface of the decomposition acceleration layer; and eliminating the liquid-repellent film with respect to a part of the liquid-repellent film, which is located on an area where the pattern is to be formed.

According to the invention, since the lyophilic film is provided on the treated surface (substrate surface), the decomposition acceleration layer is provided on the lyophilic film, and the liquid-repellent film is provided on the decomposition acceleration layer, the decomposition and elimination of the liquid-repellent film can be sped up, and further, the lyophilic property within the pattern area can be improved and accurate patterning can be performed.

Further, in the fine structure manufacturing method of the invention, it is preferred that the elimination of the liquid-repellent film is performed by irradiating the area where the pattern is to be formed in the liquid-repellent film with an electromagnetic wave.

According to the invention, by irradiating the desired pattern area of the liquid-repellent film with an electromagnetic wave, the liquid-repellent film of that part can be decomposed and eliminated, thereby the liquid-repellent film can be decomposed and eliminated at higher speed than by a conventional method.

Further, in the fine structure manufacturing method of the invention, it is preferred that, by filling the liquid material in the area where the liquid-repellent film is eliminated, and performing at least drying or baking with respect to the liquid material, the pattern is formed on the area where the liquid material is filled.

According to the invention, a desired pattern can be easily and quickly provided by filling the liquid material in the area where the liquid-repellent film is eliminated, and performing drying or baking thereon.

In addition, a device of the invention is manufactured by using the fine structure manufacturing method above.

According to the invention, for example, a device such as an optical element having preferable optical characteristics can be quickly provided at low costs.

Further, an electronic instrument of the invention is characterized by comprising the above device.

According to the invention, an electronic instrument comprising a device having a lower probability of defects than a conventional device and high efficiency can be quickly provided at a low costs.

BRIEF DESCRIPTION OF THE DRAWINGS

FIG. 7A to 7F is a view illustrating a manufacturing method of a color filter according to an embodiment of the invention.

DETAILED DESCRIPTION

First Embodiment

Figure 1:
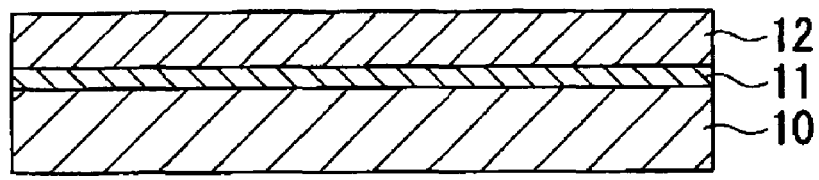
FIG. 1A to 1C is a sectional diagram illustrating a fine structure manufacturing method according to an embodiment of the invention.
Figure 1:
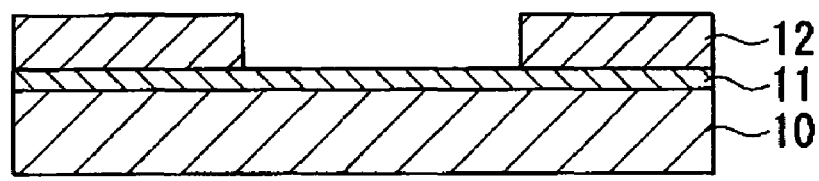
Figure 1:
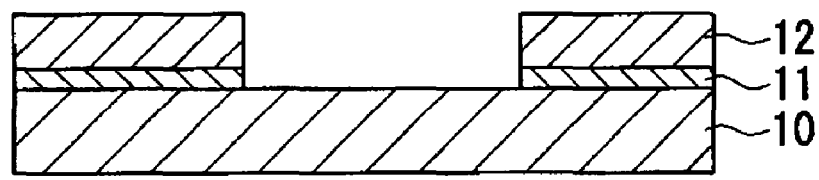

Hereinafter, a fine structure manufacturing method according to the invention will be described by referring to the drawings. In this embodiment, as an example of a fine structure, pixels of a color filter will be described.

FIG. 1 is a schematic sectional diagram illustrating a fine structure manufacturing method according to the embodiment of the invention. In FIG. 1, the main steps when forming a pattern having a desired form on a surface of a substrate 10 as a treated surface by using liquid material are shown. The substrate 10 is, for example, a substrate made of silicon or plastic. First, a lyophilic film (first film) 11 is formed on an entire upper surface of the substrate 10, as shown in FIG. 1(a).

The formation of the lyophilic film 11 is, for example, the formation of a polyethylene layer on the upper surface of the substrate 10. Alternatively, the formation of the lyophilic film 11 may be performed by, for example, irradiating the substrate 10 with an ultraviolet ray. Thereby, organic matter etc. adhered to the surface of the substrate 10 is decomposed and eliminated, and then, the substrate 10 is cleansed. By the way, the elimination of the organic matter can be accelerated by introducing oxidant gas into a chamber where the substrate 10 is disposed, and activating the oxidant gas by an ultraviolet ray to allow the gas to react with the organic matter. Further, since water on the surface of the substrate 10 evaporates by the ultraviolet irradiation, the entire surface of the substrate 10 is lyophilic treated in concurrence with cleansing. Furthermore, the lyophilic film 11 may be formed of an organic film.

Next, a liquid-repellent film 12 is formed on the entire upper surface of the lyophilic film 11. The formation of the liquid-repellent film 12 is performed by, for example, forming a fluoric resin polymerized film on the entire upper surface of the lyophilic film 11. Alternatively, the liquid-repellent film 12 may be formed of an organic film. Further, the liquid-repellent film 12 may be formed of an organic film including fluorine. These organic films can be formed by polymerization using plasma or an electromagnetic wave such as light.

Furthermore, the liquid-repellent film 12 may be formed by exposure to activated gas such as plasma including fluorine or liquid to modify the surface thereof.

Next, as shown in FIG. 1(b), a part where a desired pattern is to be formed in the liquid-repellent film 12 is eliminated. That is, an eliminated area in the liquid-repellent film 12 is an area where the pattern is formed. The elimination of the liquid-repellent film 12 is performed by irradiating the desired pattern with an electromagnetic wave. As an irradiating electromagnetic wave, an ultraviolet ray or a laser beam is preferable. For example, a fluoric resin polymerized film as the liquid-repellent film 12 can be eliminated by irradiating a part of the fluoric resin polymerized film to be eliminated with an ultraviolet ray via a predetermined mask.

Next, as shown in FIG. 1(c), a part where the desired pattern is to be formed in the lyophilic film 11 is eliminated. Note that the eliminated area in the lyophilic film 11 is the same area as the eliminated area in the liquid-repellent film 12. The elimination of the lyophilic film 11 is performed similarly to the above-described eliminating method of the liquid-repellent film 12, for example, by irradiating a part of the lyophilic film 11 to be eliminated with an ultraviolet ray via a predetermined mask.

Here, the state shown in FIG. 1(b) may be kept without performing elimination of the lyophilic film 11, as shown in FIG. 1(c).

Subsequently, liquid material is coated on (filled in) the area where the liquid-repellent film 12 (lyophilic film 11) has been eliminated. The liquid material is, for example, solvent including pigment for forming pixels of the color filter. Note that the pigment includes coloring matter of either of R (red), G (green), and B (blue), or C (cyan), M (magenta), and Y (yellow). The filling of the liquid material is performed by, for example, discharging the liquid material from an inkjet nozzle etc. to drop the liquid material in the area where the liquid-repellent film 12 has been eliminated. Here, it is preferred that a position where the liquid material is dropped is the center of the area where the liquid-repellent film 12 has been eliminated (the desired pattern).

In addition, in the fine structure manufacturing method of the invention, it is preferred that the coating of the liquid material is performed by a droplet discharging technique, a technique of supplying mist liquid material such as LSMCD, or a direct coating (cap coat) technique.

According to the invention, a required amount of liquid material can be reduced, and manufacturing steps can be simplified.

Subsequently, by performing drying and baking on the substrate 10, solvent of the liquid material is evaporated, and one pixel of the color filter (pattern), which transmits light of only one color of R, G, and B or C, M, and, Y is formed.

As described above, according to the embodiment, since the desired pattern part of the liquid-repellent film 12 formed on the lyophilic area is eliminated, the liquid-repellent area can be eliminated faster than in the case of eliminating the liquid-repellent area directly formed on the substrate 10, and the manufacturing time can be shortened. Further, according to the embodiment, the lyophilic film 11 is first provided on the entire surface of the treated surface of the substrate 10, the entire substrate 10 is cleansed by this treatment of providing the lyophilic film 11, thereby the substrate 10 can be prevented from being contaminated.

Figure 2:
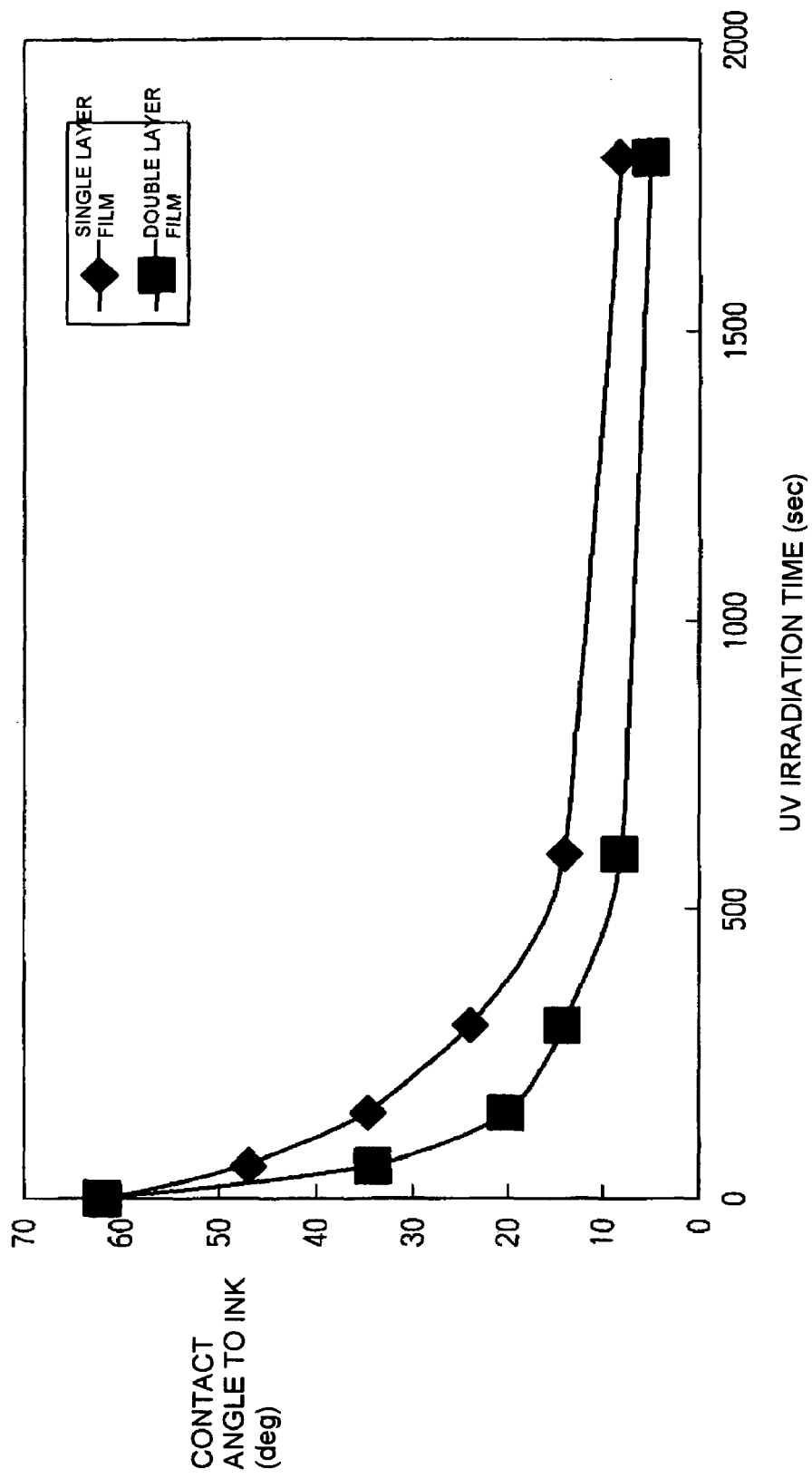
FIG. 2 is a view illustrating an experimental result showing that an elimination speed of a liquid-repellent film is improved by the manufacturing method above.

Next, an experimental result showing that the speed of eliminating the liquid-repellent film is improved by the manufacturing method of the embodiment will be described by referring to FIG. 2. FIG. 2 is a graphic representation showing a relationship between time for ultraviolet (UV) irradiation of liquid-repellent films formed by the manufacturing method of the embodiment and a conventional manufacturing method and liquid repellency (or lyophilic property) of the irradiated surfaces thereof.

In FIG. 2, the horizontal axis indicates time (sec) for ultraviolet irradiation to the irradiated surface, and the vertical axis indicates a contact angle (deg) to ink (liquid material) on the irradiated surface. The larger the contact angle is, the higher the liquid repellency is and the less the eliminated amount of the liquid-repellent film is. Reversely, the smaller the contact angle becomes, the lower the liquid repellency becomes, the higher the lyophilic property becomes, and the more the eliminated amount of the liquid-repellent film is. For example, when the contact angle is equal to or less than 5 (deg), almost all of the liquid-repellent film has been eliminated.

Further, of the two characteristic curves in FIG. 2, an upper curve (curve with diamond points) shows characteristics of the conventional manufacturing method by which the liquid-repellent film 12 is directly formed on the upper surface of the substrate 10 (single film), and a lower curve (curve with square points) shows characteristics of the manufacturing method of the embodiment by which the lyophilic film 11 is formed on the upper surface of the substrate 10 and the liquid-repellent film 12 is formed on the lyophilic film 11 (double layer film).

It is clear that with respect to the time required for ultraviolet irradiation to obtain a desired contact angle of, for example, equal or less than 5 (deg), the characteristic curve of the manufacturing method of the embodiment shows shorter time than the characteristic curve of the conventional manufacturing method. Therefore, by the experimental result in FIG. 2, according to the manufacturing method of the embodiment, it is made clear that the speed of eliminating the liquid-repellent film is improved relative to the conventional manufacturing method.

The reason for the above-described effect will be described below. For example, the substrate 10 is a silicon substrate. When forming the liquid-repellent film 12 made of fluorine etc. directly on the silicon, the silicon and the fluorine are securely bonded to become in a chemically stable state. This chemically stable state can hardly be decomposed even by ultraviolet irradiation. Therefore, in the conventional manufacturing method, since the liquid-repellent film formed directly on the silicon substrate etc. is eliminated by ultraviolet irradiation, the elimination of the liquid-repellent film takes a long time.

On the other hand, in the manufacturing method of the embodiment, the lyophilic film 11 is provided on the substrate 10 such as silicon, and on this lyophilic film 11, the liquid-repellent film 12 is provided. Thereby, since the fluorine etc. of the liquid-repellent film 12 and the silicon are not bonded, and the bonding of the fluorine etc. of the liquid-repellent film 12 and polyethylene etc. of the lyophilic film 11 is weak, the liquid-repellent film 12 can be decomposed and eliminated at a relatively higher speed by irradiating the liquid-repellent film 12 with an ultraviolet ray.

Thus, according to the manufacturing method of the embodiment, the liquid-repellent film can be eliminated at higher speed than in the case of the conventional manufacturing method, and time for patterning can be shortened.

In the above-described embodiment, the time for patterning may be shortened by providing a decomposition acceleration layer having a function of accelerating the decomposition of the liquid-repellent layer 12 in place of the lyophilic film 11 to shorten the time for decomposing and eliminating the liquid-repellent layer 12. In other words, the decomposition acceleration layer is provided on the upper surface of the substrate 10, and the liquid-repellent layer 12 is provided on an upper surface of the decomposition acceleration layer. Then, a desired pattern portion of the liquid-repellent layer 12 is irradiated with light such as ultraviolet light to eliminate the liquid-repellent layer 12 in the pattern portion. The decomposition acceleration layer is formed, for example, by material including $TiO_2$ that is photoactive (volatilized by receiving light) when performing patterning by exposure to light. Note that the lyophilic film 11 in the above-described embodiment shown in FIG. 1 also serves as the decomposition acceleration layer.

Furthermore, in the above-described embodiment shown in FIG. 1, by providing a sacrificial layer in place of the lyophilic film 11, damage to the surface of the substrate 10 when performing treatment of eliminating the liquid-repellent film 12 may be suppressed. In other words, the sacrificial layer is provided on the upper surface of the substrate 10 and the liquid-repellent film 12 is provided on an upper surface of the sacrificial layer.

For example, the substrate 10 is a silicon substrate or a plastic substrate, and the surface of the substrate 10 is the treated surface. The sacrificial layer in place of the lyophilic film 11 is made of either polyethylene, polypropylene, or resist.

Next, patterning (decomposition and elimination) of the liquid-repellent film 12 is performed by, for example, physical means such as a laser beam or an electron beam. By doing that, for example, in the case where the substrate 10 has transparent optical characteristics, since the sacrificial layer shields the substrate 10 from being irradiated with a laser beam or an electron beam, the substrate 10 can be prevented from being damaged and the optical characteristics of the substrate 10 can be maintained. Then, after forming the desired pattern with respect to the liquid-repellent film 12, the sacrificial layer is eliminated by a chemical technique (for example, wet etching).

In addition, in the case where a physical or chemical reaction occurs between the liquid-repellent film 12 and the substrate 10, the above-described sacrificial layer may be a layer having a function of suppressing degradation of a characteristic of a film formed layer (layer provided by drying and baking liquid material) due to contamination of the substrate 10, and degradation of adhesion between the film formed layer and the substrate 10. For example, in the case where the substrate 10 is silicon or glass, when providing the liquid-repellent film 12 directly on the substrate 10, patterning (eliminating) the liquid-repellent film 12, and filling the liquid material as a material for forming the color filter in the patterning portion, bonding of the silicon of the substrate and the fluorine of the liquid-repellent film 12 will occur. Therefore, providing the sacrificial layer between the substrate 10 and the liquid-repellent film 12, the bonding of the silicon and the fluorine can be prevented from occurring, the characteristic of the film formed layer can be prevented from being degraded, and the adhesion between the substrate and the film formed layer can be prevented from being degraded.

Figure 3:
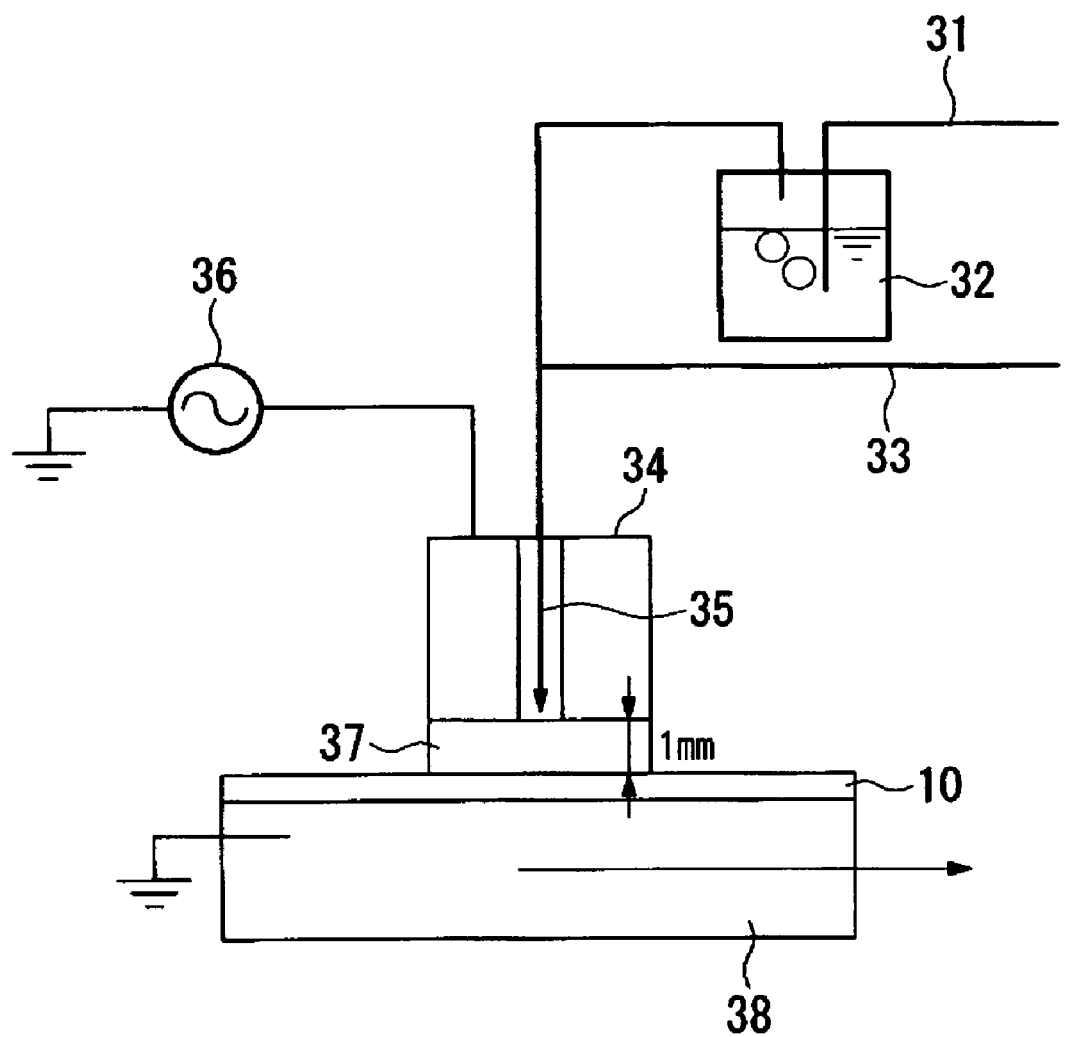
FIG. 3 is a schematic view illustrating an example of a lyophilic film forming device.

Next, an example of a method for forming the lyophilic film 11 in the above-described embodiment will be specifically described by referring to FIG. 3. FIG. 3 is a schematic view illustrating an example of a lyophilic film forming device. This lyophilic film forming device is for forming a lyophilic film on the surface of the substrate 10 by turning helium (He) gas including n-decane into plasma under atmospheric pressure and irradiating the substrate 10 with the plasma. In the lyophilic film forming device, helium gas 31 is fed into n-decane solution existing in a container 32 at flow rate of 100 sccm. The helium gas including n-decane by bubbling is fed from the container 32 to a first electrode 34. Further, the helium gas 33 is fed to the first electrode 34 at a flow rate of 10 slm.

Furthermore, a high-frequency voltage having a frequency of, for example, 13.56 MHz is applied from a high-frequency power supply 36 to the first electrode 34. Here, the power supplied from the high-frequency power supply 36 to the first electrode 34 is set to 400 W, for example. A stage 38 serving as a second electrode is disposed in a position opposite to the first electrode 34.

The stage 38 is movable in the horizontal direction while keeping a predetermined distance relative to a lower end of the first electrode 34. The distance (gap) between the first electrode 34 and the stage (second electrode) 38 is set to 1 mm, for example. The movement speed of the stage 38, i.e., the conveyance speed of the substrate 10 is set to 0.46 mm/sec, for example. The substrate 10 as a treated object is positioned on the stage 38.

The helium gas 35 including n-decane and fed into the first electrode 34 is turned into plasma 37 and released from the electrode 34 to which the high-frequency voltage is applied, and the upper surface of the substrate 10 is irradiated. Thereby, a lyophilic film is formed on the upper surface of the substrate 10. Then, since the substrate 10 is moved together with the stage 38 in the horizontal direction, the lyophilic film is formed on the entire upper surface of the substrate 10.

Figure 4:
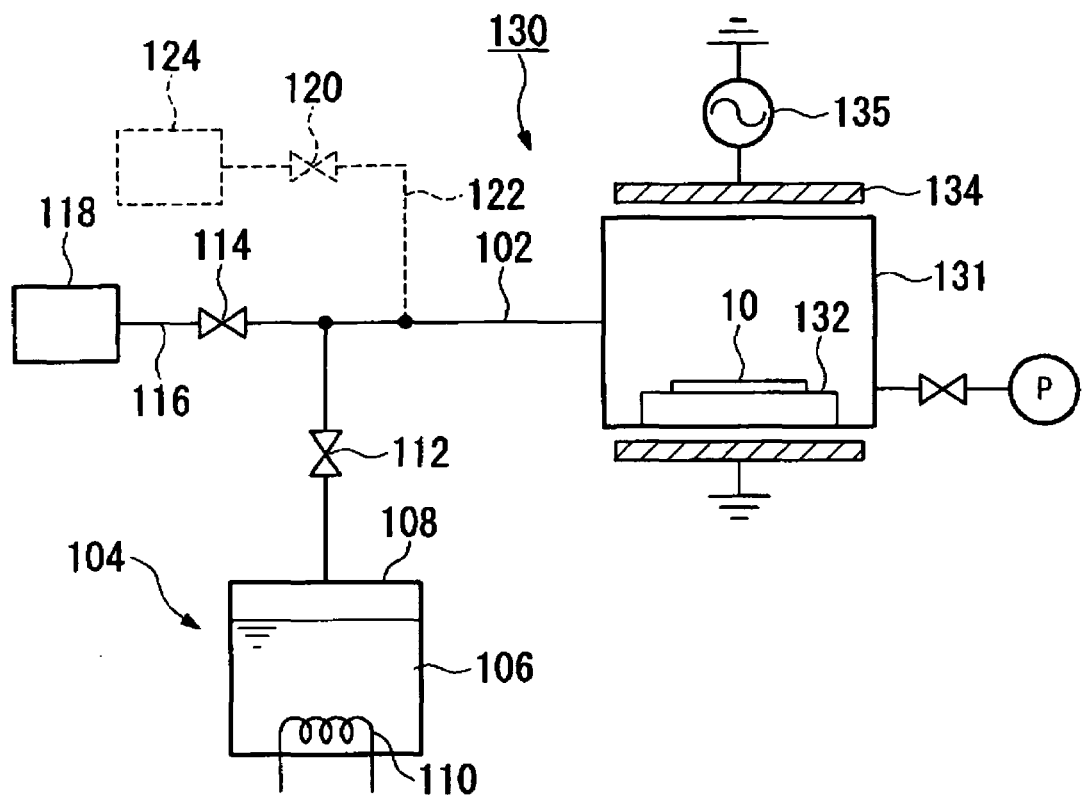
FIG. 4 is a schematic view illustrating an example of a liquid-repellent treatment device.

Next, an example of a forming method of the liquid-repellent film 12 in the above-described embodiment will be specifically described by referring to FIG. 4. FIG. 4 is a schematic view illustrating an example of a liquid-repellent treatment device for forming a polymerized film as the liquid-repellent film.

The liquid-repellent treatment device 130 has a treatment chamber 131, and the device is adapted so that the substrate 10 as a treated object such as a silicon wafer may be disposed on a treatment stage 132 provided inside the treatment chamber 131. High-frequency electrodes 134 are disposed on upper and lower sides of the treatment chamber 131, and the high-frequency electrode 134 is connected to a high-frequency power supply 135.

Further, a treatment gas supply unit 104 is connected to the treatment chamber 131 via a supply pipe 102 with a flow rate control valve 112. The treatment gas supply unit 104 has a container 108 for storing liquid organic matter 106 consisting of straight-chain PFC such as C4F10 and C8F18. In the container 108, a heater 110 as a heating portion is provided to heat and evaporate the liquid organic matter 106. Further, on a downstream side of the flow rate control valve 112 of the supply pipe 102, a carrier gas supply unit 118 is connected via a carrier pipe 116 with a flow rate control valve 114. As a carrier gas, inactive gas such as nitrogen or argon is used.

By the way, as shown by a dashed line in FIG. 4, a second treatment gas supply unit 124 may be connected to the supply pipe 102 via a pipe 122 having a flow rate control valve 120. In this case, CF4 as second treatment gas is added to vapor of the liquid organic matter 106 from the second gas treatment supply unit 124. In the treatment chamber 131, mixed gas of the organic matter vapor and the CF4 is turned into plasma. Then, activated fluorine reacts with the vapor of the liquid organic matter 106 and is captured in a fluorine eliminated portion within a polymerized film on the surface of the substrate 10, and thus, liquid repellency of the polymerized film can be improved.

As the liquid-repellent film 12 of the above-described embodiment, organic matter including fluorine can be used as a forming member. Specifically, as fluorinate etc. for forming a polymerized film, C8F18, C7F16, C6F14, C5F12, etc. can be used as the forming member of the liquid-repellent film 12. Further, C4F8 as PFC gas can be used as the forming member of the liquid-repellent film 12. Furthermore, a surface active agent (for example, DynaSylan-F-8263 or DynaSylan-F-8261 etc.) may be used as the forming member of the liquid-repellent film 12.

Figure 5:
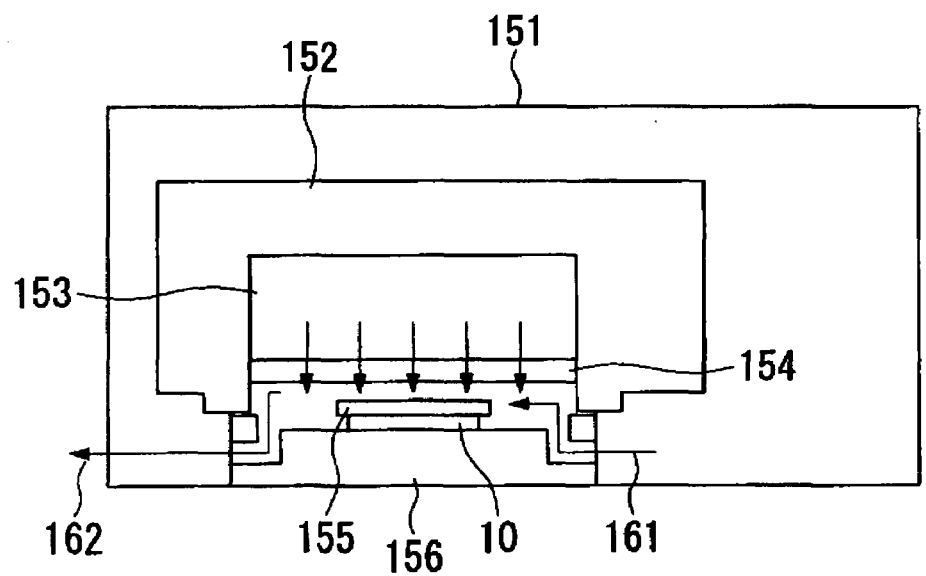
FIG. 5 is a schematic sectional view illustrating an example of a patterning device.

Next, an example of a patterning (decomposing and eliminating) method of the liquid-repellent film 12 in the above-described embodiment will be described by referring to FIG. 5. FIG. 5 is a schematic sectional view illustrating an example of a patterning device used when patterning the liquid-repellent film 12.

This patterning device comprises a local exhaust hood 151 provided to cover the entire device, a lamp house 152 disposed on an upper side within the local exhaust hood 151, an excimer UV light source 153 disposed inside of the lamp house 152, a synthetic quartz (silica glass) 154 disposed on a bottom of the lamp house 152.

Further, in the local exhaust hood 151, a holder 156 is disposed on a lower side of the synthetic quartz 154. On the holder 156, the substrate 10 as a treated object is disposed. Here, a space is provided between an upper surface of the holder 156 and the synthetic quartz 154, and nitrogen N2 is fed from an inlet port 161 of the space and exhausted out of an outlet port 162 of the space (or the local exhaust hood 151).

A wavelength of an ultraviolet ray emitted from the excimer UV light source 153 is set to 172 nm, for example. The type of excimer UV light source 153 is the Xe2 type, for example. Irradiation time of an ultraviolet ray is set to 15 minutes, for example. On the other hand, a metal mask 155 is placed on the upper surface of the substrate 10. This metal mask 155 has a hole punched only in a portion of a desired form pattern.

Therefore, the ultraviolet ray emitted from the excimer UV light source 153 pass through the synthetic quartz 154 and the metal mask 155 is irradiated. An ultraviolet ray passing through the hole of the metal mask 155 of the irradiating ultraviolet rays reaches the liquid-repellent film on the upper surface of the substrate 10. Here, the ultraviolet irradiation of the liquid-repellent film on the upper surface of the substrate 10 is performed in a nitrogen atmosphere. Thus, the irradiated liquid-repellent film with an ultraviolet ray is decomposed and eliminated, and exhausted out of the outlet port 162 as exhaust.

Figure 6A:
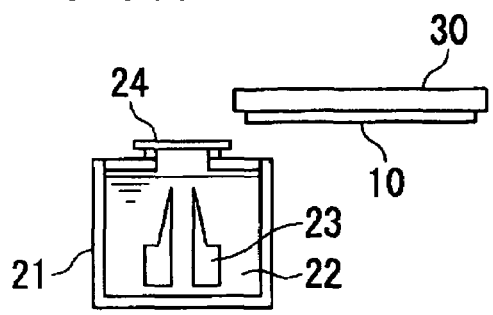
FIG. 6A to 6F is a sectional diagram illustrating a coating method of a cap coat technique.

In the above-described embodiment, as a method for forming the lyophilic film 11 or the liquid-repellent film 12, or coating method of liquid material, a cap coat technique as a coating method utilizing a capillary phenomenon may be used. FIG. 6 is a sectional diagram illustrating the coating method of a cap coat technique. As shown in FIG. 6(a), a container 21 contains liquid material (resist) 22 serving as a coating member and a capillary tube (cap coat) 23. The container 21 is generally sealed by a lid 24. The substrate 10 as a coated member is supported on a lower surface side of a supporting member 30 that is movable in parallel.

Figure 6B:
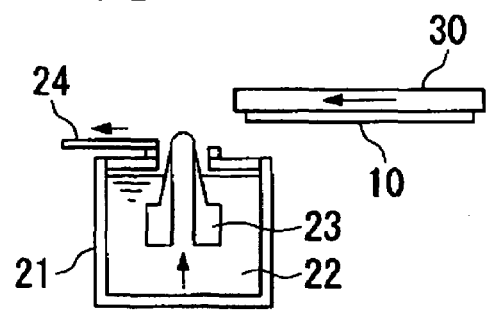

In order to perform coating treatment, at first, as shown in FIG. 6(b), the lid 24 is opened by sliding in a direction of an arrow, and the supporting member 30 is also slid in the direction of the arrow (toward the lid 24). When opening the lid 24, the capillary tube 23 moves upwardly and an upper end of the capillary tube 23 comes out above the liquid level of the liquid material 22. Thereby, the liquid material 22 is absorbed to the upper end of the capillary tube 23.

Figure 6C:
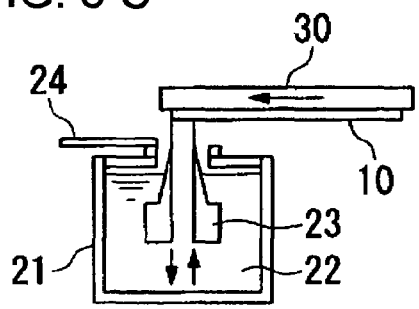

Then, as shown in FIG. 6(c), by sliding the supporting member 30 further in the direction of the arrow, the coated surface of the substrate 10 is moved closer to the upper end of the capillary tube 23. Thereby, the liquid material 22 absorbed by the capillary tube 23 is coated on the coated surface of the substrate 10.

Figure 6D:
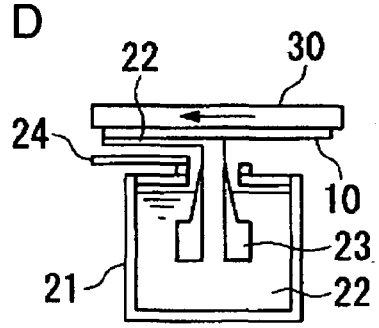

Subsequently, as shown in FIG. 6(d), by sliding the supporting member 30 still further in the direction of the arrow, the liquid material 22 absorbed by the capillary tube 23 is coated on the entire coated surface of the substrate 10.

Figure 6E:
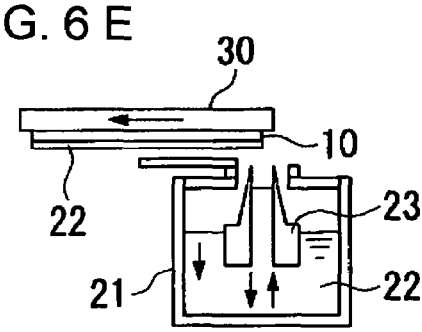

Next, as shown in FIG. 6(e), after coating on the entire coated surface of the substrate 10 is completed, the capillary tube 23 is moved downward. Here, since the coated surface of the substrate 10 is apart from the upper end of the capillary tube 23, the absorption of the liquid material 22 by the capillary tube 23 is stopped.

Figure 6F:
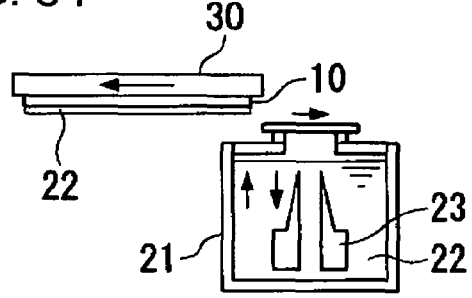

Then, as shown in FIG. 6(f), the capillary tube 23 is further moved downward to bury the capillary tube 23 into the liquid material 22. Concurrently, the lid 24 is closed by sliding in a direction of an arrow. Thus, the coating of the liquid material 22 on the entire coated surface of the substrate 10 is completed.

Here, with respect to the coated surface of the substrate 10, by performing lyophilic treatment on a desired pattern area and liquid-repellent treatment on an area other than the pattern area in advance, even when coating the liquid material on the entire treated surface by the above cap coat technique, liquid material can be filled only in the pattern area.

Manufacturing Process of Color Filter

Next, an example of manufacturing a color filter by using the fine structure manufacturing method according to the above-described embodiment will be described by referring to FIGS. 7 to 10.

A substrate 200 is used in FIG. 7 that is a transparent substrate having reasonable mechanical strength and high light transmittance. As the substrate 200, for example, a transparent glass substrate, acrylic glass, a plastic substrate, a plastic film, and surface treated materials thereof, etc. can be employed.

Figure 8:
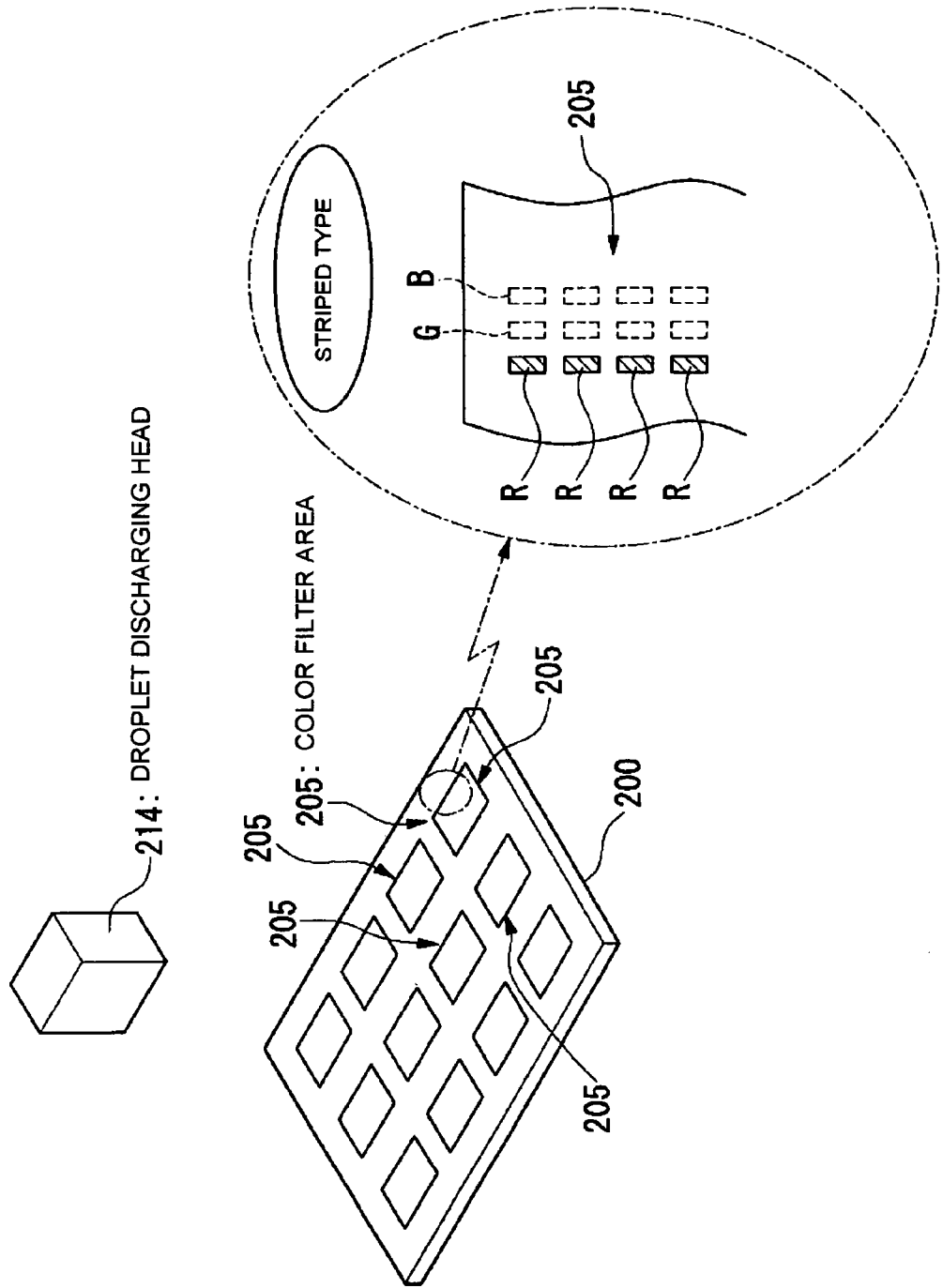
FIG. 8 is a view illustrating a substrate and a part of a color filter area on the substrate.

For example, on the rectangular-shaped substrate 200, as shown in FIG. 8, a plurality of color filter areas 205 are formed in a matrix form to improve productivity. These color filter areas 205 can be used as color filters adapted to liquid crystal display devices by cutting the glass 200 afterward.

In the color filter areas 205, for example, as shown in FIG. 8, R liquid, G liquid, and B liquid are formed and arranged in a predetermined pattern. As the formed pattern, other than a conventionally-known striped type, as shown in the drawing, there are a mosaic type, a delta type and a square type, etc.

FIG. 7 shows an example of steps of forming the color filter areas 205 on the substrate 200.

In FIG. 7(a), a black matrix 210 is formed on one surface of the transparent substrate 200. On the substrate 200 serving as a base of the color filter, the black matrix 210 is provided in a matrix form by coating resin having no light transmittance (preferably black) in a predetermined thickness (for example, about 2 μm) by a method such as spin coating and using a method such as a photolithography technique. A minimum display component surrounded by grids of the black matrix 210 is referred to as a filter element 212, and, for example, a window having a width of about 30 μm in an X axis direction and length of about 100 μm in a Y axis direction.

After forming the black matrix 210, the resin on the substrate 200 is baked by, for example, applying heat by a heater.

Next, a lyophilic film (not shown) is provided on the entire upper surface (treated surface) of the substrate 200, which includes the black matrix 210 and the filter elements 212. Then, a liquid-repellent film (not shown) is provided on an upper surface of the lyophilic film. Subsequently, the liquid-repellent film on the filter elements 212 is eliminated.

As shown in FIG. 7(b), droplets 99 land in the filter elements 212. The amount of the droplets 99 is sufficiently determined by considering the volume decrease of the liquid in a heating step.

In a heating step in FIG. 7(c), after filling the droplets 99 in all of the filter elements 212 on the color filter, heat treatment is performed by a heater. The substrate 200 is heated to a predetermined temperature (for example, about 70° C.). When the solvent of the liquid is evaporated, the volume of the liquid is decreased. In the case where the volume decrease is great, the liquid discharging step and the heating step are repeated until a liquid film having a sufficient thickness as a color filter is obtained. By this treatment, the solvent of the liquid is evaporated and consequently, a solid part of the liquid remains there and forms a film.

In an overcoating film forming step in FIG. 7(d), heating is performed at a predetermined temperature and in a predetermined period to dry the droplets 99 completely. After the drying is completed, an overcoating film 220 is formed for protecting the substrate 200 of the color filter, on which the liquid film has been formed, and planarizing the surface of the filter. The overcoating film 220 may be formed, for example, by a method such as a spin coating technique, a roll coating technique, and a ripping technique.

In a transparent electrode forming step in FIG. 7(e), a transparent electrode 230 is formed over an entire surface of the overcoating film 220 by using a sputtering technique, a vacuum absorbing technique, etc.

In a patterning step in FIG. 7(f), the transparent electrode 230 is additionally patterned into pixel electrodes corresponding to openings of the filter elements 112.

Figure 9:
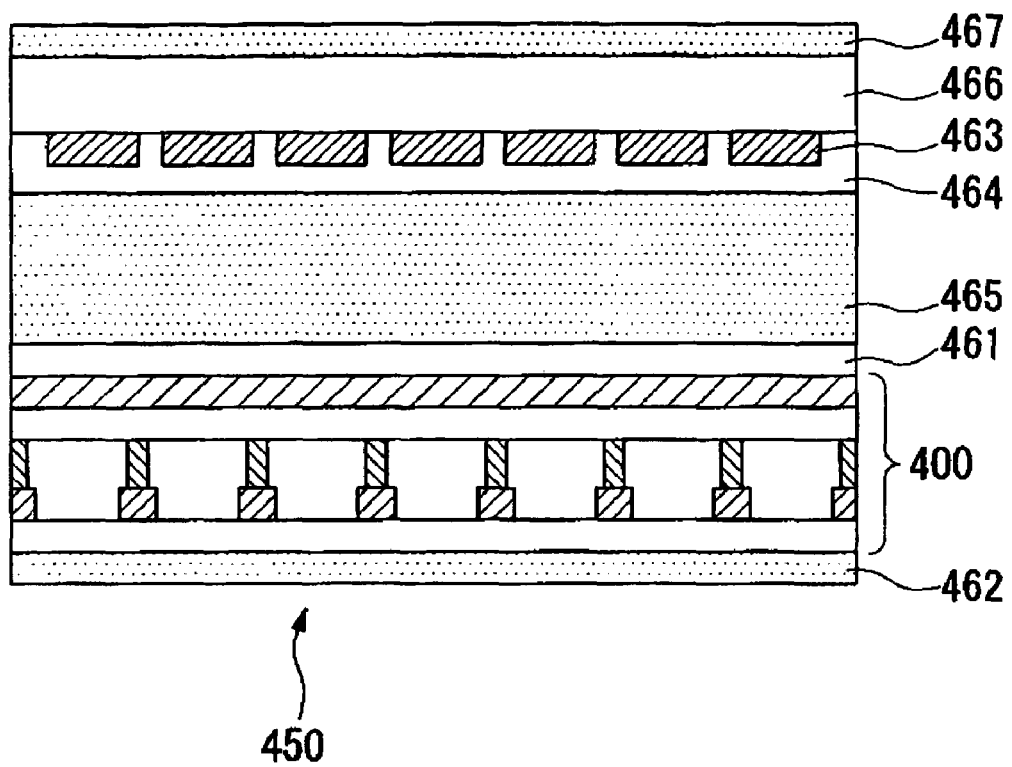
FIG. 9 is a sectional view of a liquid crystal panel comprising a color filter manufactured by using the invention.

Note that, in the case where a TFT (Thin Film Transistor) etc. is used for driving a liquid crystal display panel, the patterning is unnecessary. FIG. 9 shows an example of the color filter manufactured by using the invention and a liquid crystal panel having a counter substrate etc. In this drawing, a liquid crystal panel 450 is constituted by combining a color filter 400 and a counter substrate 466 between upper and lower polarization plates 462, 467, and enclosing liquid crystal composition 465 between them. Further, alignment films 461, 464 are positioned between the color filter 400 and the counter substrate 466, and on an inner side surface of the counter substrate 466, TFT (thin-film transistor) elements (not shown) and pixel electrodes 463 are formed in a matrix form. In this liquid crystal panel, as the color filter 400, a color filter manufactured by the above-described manufacturing method is used.

As described above, in the embodiment, the lyophilic film is provided on the entire upper surface (treated surface) of the substrate 200, which includes the black matrix 210 and filter elements 212, then the liquid-repellent film is provided on the upper surface of the lyophilic film, then the liquid-repellent film on the filter elements 212 is eliminated, and then the droplets 99 are filled in the filter elements 212. Thereby, the treated surface and the liquid-repellent film are not bonded, and the liquid-repellent film is easily decomposed and eliminated at high speed. Therefore, according to the embodiment, in a manufacturing process of a color filter, a pattern having a desired form can be formed at high speed.

Further, according to the embodiment, since the lyophilic film is provided on the treated surface, the treated surface is cleansed and contamination can be prevented, thereby, the pattern of the color filter can be preferably formed.

Furthermore, according to the embodiment, in the treatment of decomposing and eliminating the liquid-repellent film, since the treated surface can be prevented from being damaged by the lyophilic film, a color filter having preferable optical characteristics can be manufactured.

Figure 10:
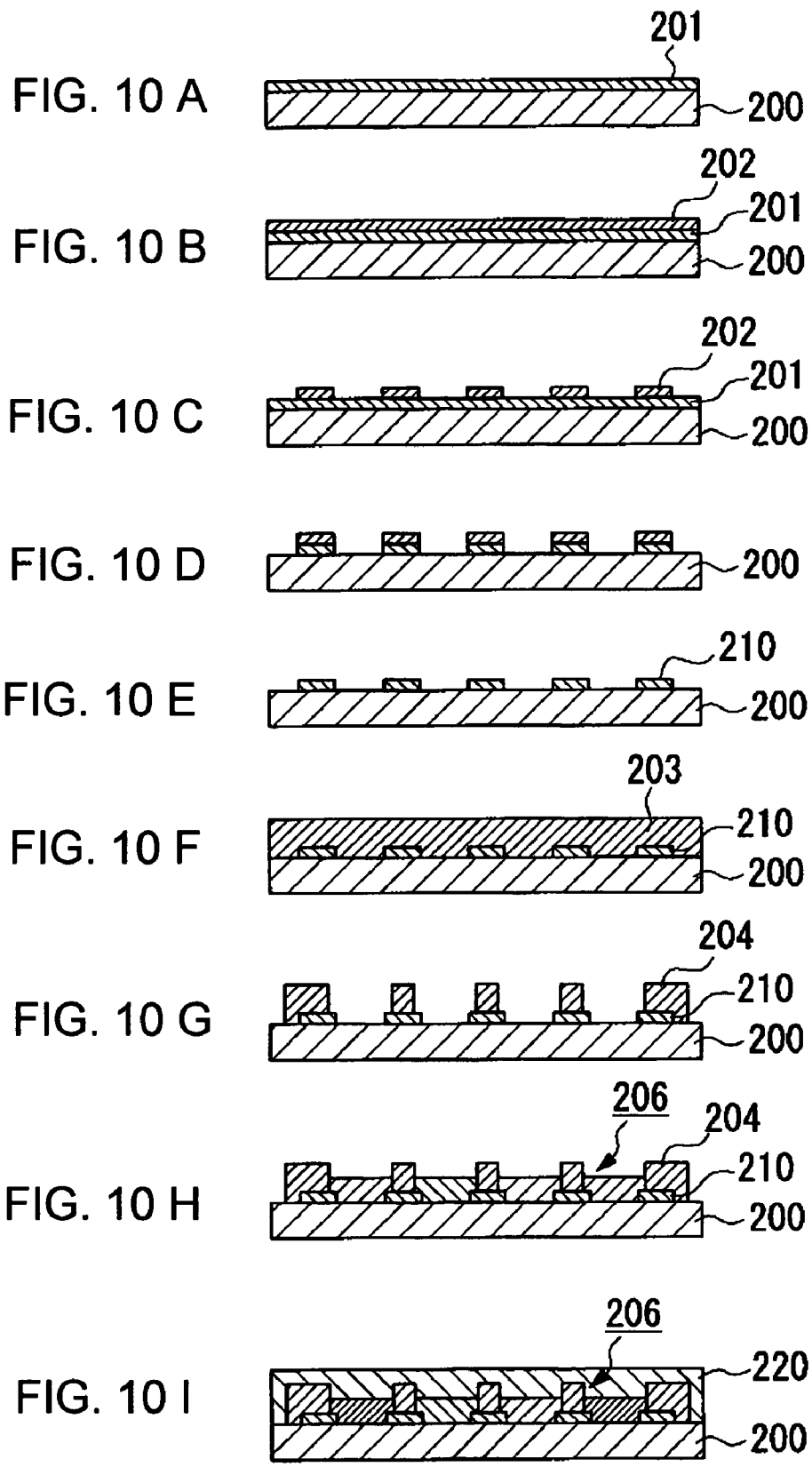
FIG. 10(a) to (i) are views illustrating an example of manufacturing a color filter.

In addition, a color filter manufacturing method is not limited to the method shown in FIG. 7, various methods can be adopted. Another embodiment of a manufacturing method is shown in FIG. 10. For example, a surface of a transparent substrate 200 made of no-alkali glass is cleansed with cleaning liquid made by adding hydrogen peroxide solution of 1% by weight to heated concentrated sulfuric acid, rinsed with purified water, and then air dried, thereby a clean surface is obtained. Then, on this surface, a chrome film is formed in predetermined film thickness by a sputtering technique and a metal layer 201 is obtained (see FIG. 10(a)). On a surface of this metal layer 201, photo resist is spin coated. The substrate 200 is dried for five minutes at 80° C. on a hot plate, and a photo resist layer 202 is formed (see FIG. 10(b)). On a surface of this substrate, a mask film having a desired matrix pattern form drawn therein is adhered and exposure to an ultraviolet ray is performed. Next, this is immersed in alkali developing liquid including potassium hydroxide, and photo resist of an unexposed portion is eliminated, and the resist layer 202 is patterned (see FIG. 10(c)). Subsequently, the exposed metal layer 201 is etched and eliminated with etching solution with hydrochloric acid as the main component (see FIG. 10(d)), and concurrently, the resist on the chrome is eliminated. As described above, a light shielding layer (black matrix) 210 having the predetermined matrix pattern is obtained (see FIG. 10(e)).

On the entire surface on the substrate 200, negative transparent acrylic photosensitive resin composition 203 is additionally coated also by the spin coating technique (FIG. 10(f)). After pre-baking, ultraviolet exposure is performed by using the mask film in which the predetermined matrix pattern form is drawn. The resin on the unexposed portion is developed with developing liquid, rinsed with purified water, and then spin-dried. After-baking is performed as a final drying step to sufficiently harden the resin portion, and banks 204 are formed (see FIG. 10(g)).

Next, a lyophilic film (not shown) is provided on an entire upper surface (treated surface) of the substrate 200, which includes the banks 204 and the light shielding layer (black matrix) 210. Then, a liquid-repellent film (not shown) is provided on the banks 204. It is preferred that this liquid-repellent film is formed by using the separate mask described in the above embodiment.

Subsequently, material for forming filters of respective colors of R, G, B is discharged into the banks 204 by using a droplet discharging device. Then, heating the substrate 200 to perform the curing treatment of the filter material, and a color filter layer is obtained (see FIG. 10(h)). Then, a color filter can be obtained by coating transparent acrylic resin paint on the manufactured color filter substrate to form an overcoating layer 220 (over coating layer) (see FIG. 10(i)).

Second Embodiment: Manufacturing Process of EL Display Device

Next, an example of manufacture of an EL (electro luminescent) display device by using the fine structure manufacturing method of the above-described embodiment will be described by referring to FIG. 11. The EL display device is an element that has a structure in which a thin film including fluorescent inorganic and organic compounds is sandwiched by a cathode and an anode, and for producing an exciton by injecting an electron and a hole into the thin film and recombining them, and emitting by utilizing emission of light (fluorescence, phosphorescence) when the exciton is deactivated. A self-luminous full color EL display device can be manufactured by droplet discharging and patterning materials exhibiting emission colors of red, green, and blue of the fluorescent materials used for such EL display element on an element substrate surface of TFT etc. using the device manufacturing apparatus of the invention. The range of the device of the invention includes the substrate of such an EL display device.

Figure 11:
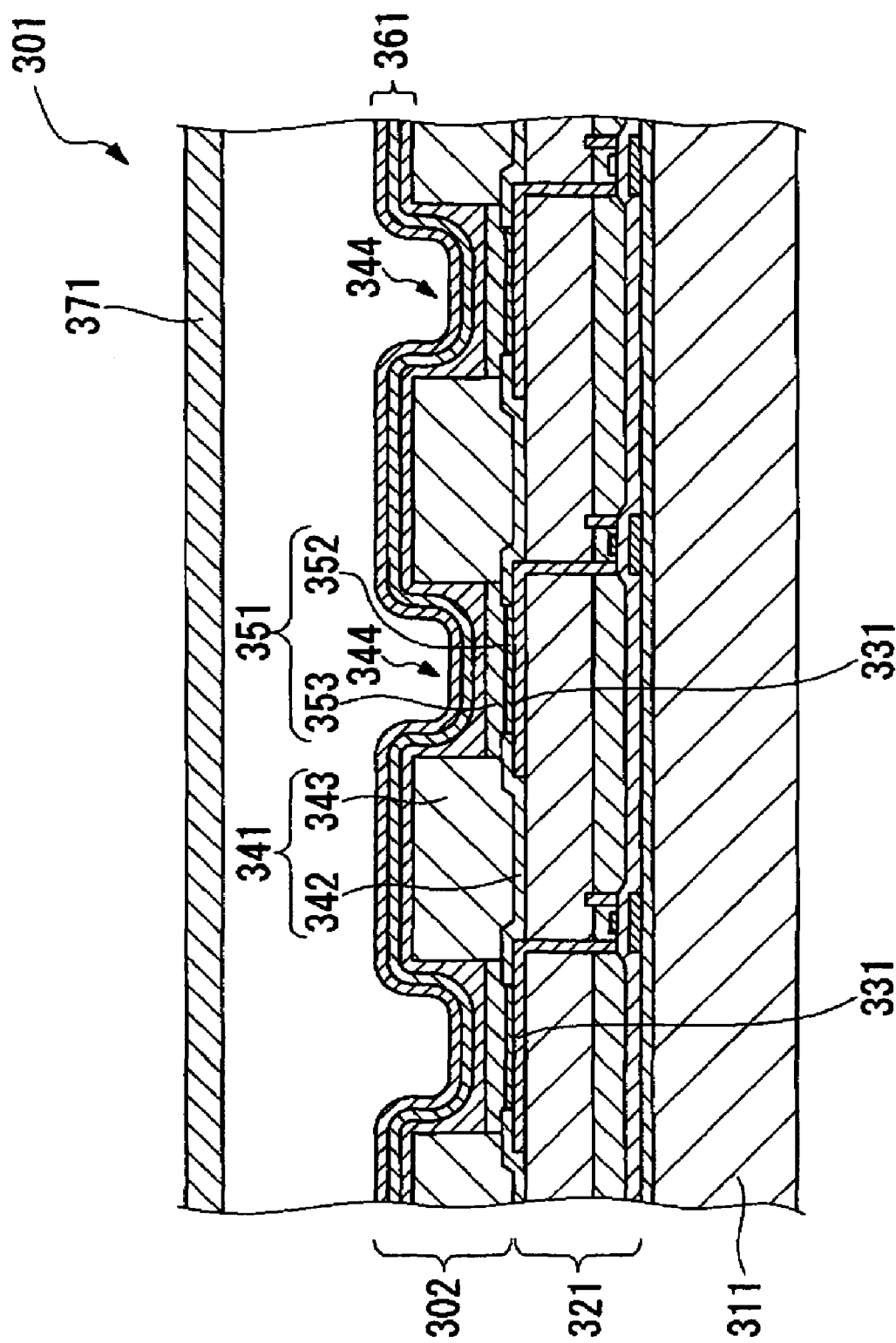
FIG. 11 is a sectional view of an organic EL device to which a manufacturing method of the invention is applied.

FIG. 11 is a view of a section of an organic EL device as an example of a device to which the manufacturing method of the embodiment described above is applied.

As shown in FIG. 11, this organic EL device 301 connects a wiring of a flexible substrate (not shown) and a driving IC (not shown) to an organic EL element 302 constituted by a substrate 311, a circuit element section 321, pixel electrodes 331, bank portions 341, light emitting elements 351, a cathode 361 (counter electrode), and a sealing substrate 371. The circuit element section 321 is formed on the substrate 311, and a plurality of pixel elements 331 are aligned on the circuit element section 321. The bank portions 341 are formed in a grid form between respective pixel electrodes 331, and light emitting elements 351 are formed in recessed openings 344 formed by the bank portions 341. The cathode 361 is formed on an entire surface of an upper portion of the bank portions 341 and the light emitting elements 351, and a sealing substrate 371 is laminated on the cathode 361.

The manufacturing process of the organic EL device 301 including the organic EL element comprises a bank portion forming step of forming bank portions 341, a plasma treatment step for suitably forming the light emitting elements 351, a light emitting element forming step of forming the light emitting elements 351, a counter electrode forming step of forming the cathode 361, and a sealing step of sealing by laminating the sealing substrate 371 on the cathode 361.

The light emitting element forming step forms the light emitting element 351 by forming a hole injection/transport layer 352 and a light emitting layer 353 on the recessed opening 344, i.e., the pixel electrode 331, and comprises a hole injection/transport layer forming step and a light emitting layer forming step. The hole injection/transport layer forming step has a first droplet discharging step of discharging a first composition (functional liquid) for forming the hole injection/transport layer 352 on each pixel electrode 331, and a first drying step of drying the discharged first composition to form the hole injection/transport layer 352. The light emitting layer forming step has a second droplet discharging step of discharging a second composition (functional liquid) for forming the light emitting layer 353 on the hole injection/transport layer 352, and a second drying step of drying the discharged second composition to form the light emitting layer 353. In this light emitting layer forming step, the above-described light emitting element is formed by using, for example, a droplet discharging device.

In this case, the fine structure manufacturing method of the embodiment may have a step of providing a lyophilic film and a liquid-repellent film on resin resist, the pixel electrode, and a surface (treated surface) of a layer as a lower layer for providing easy adhesion of the EL material to a desired pattern. Specifically, a lyophilic film is provided on an entire treated surface, and then, a liquid-repellent film is formed on an upper surface of the lyophilic film. Subsequently, the liquid-repellent film is eliminated in a part (of the liquid-repellent film) on the desired pattern. Then, the EL material is coated on (filled in) the desired pattern as the part in which the liquid-repellent film is eliminated. As described above, the EL display device manufactured by using the fine structure manufacturing method of the embodiment can be utilized for segment display and still image display in which light is simultaneously emitted on an entire surface, for example, an application to a low information field such as drawings, characters, labels, or as a light source having a form of point, line, or plane. Further, a full color display device having high intensity and good response can be obtained by using not only a passive drive display element but also an active element such as a TFT. Furthermore, when providing metal material or insulative material to the fine structure manufacturing method of the embodiment, direct fine patterning of a metal wiring, an insulative film, etc. can be performed, and the manufacturing method can be applied to manufacture of a PDP (plasma display panel) utilizing such metal wiring forming technique, or fabrication of a new highly functional device such as a radio tag antenna.

Third Embodiment: Electronic Instrument

Examples of electronic instruments having the optical element (color filter) of the above-described embodiment will be described.

Figure 12:
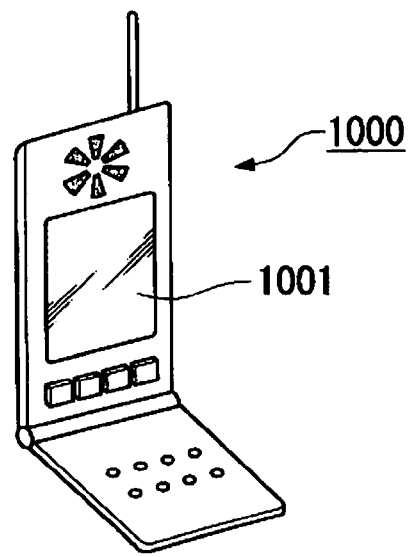
FIG. 12 is a view illustrating an example of an electronic instrument with an optical element of the invention.

FIG. 12 is a perspective view illustrating an example of a cellular phone. In FIG. 12, the sign "1000" denotes a cellular phone main body, and the sign "1001" denotes a display portion using the above-described color filter.

Figure 13:
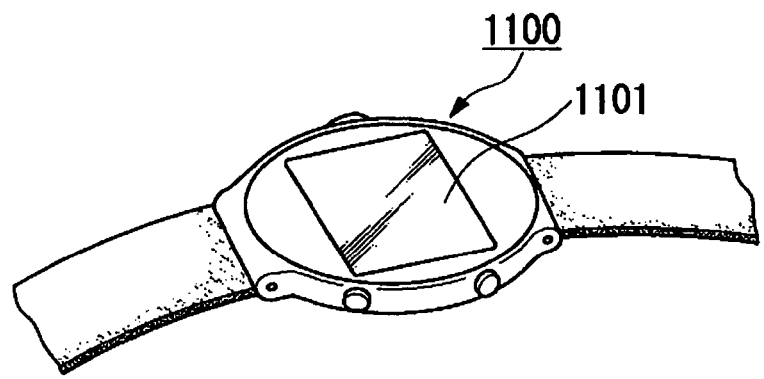
FIG. 13 is a view illustrating an example of an electronic instrument with an optical element of the invention.

FIG. 13 is a perspective view illustrating an example of a wrist watch type electronic instrument. In FIG. 13, the sign "1100" denotes a watch main body, and the sign "1101" denotes a display portion using the above-described color filter.

Figure 14:
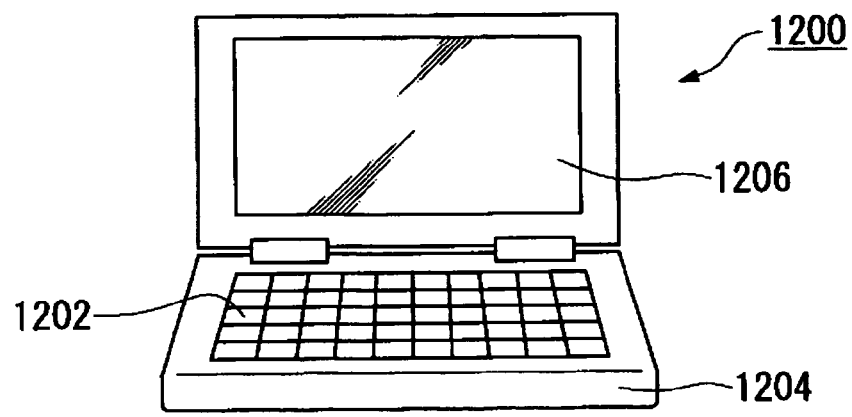
FIG. 14 is a view illustrating an example of an electronic instrument with an optical element of the invention.

FIG. 14 is a perspective view illustrating an example of a portable information processing device such as a word processor and a personal computer. In FIG. 14, the sign "1200" denotes an information processing device, the sign "1202" denotes an input section such as a keyboard, the sign "1204" denotes information processing device main body, and the sign "1206" denotes a display portion using the above-described color filter.

Since the electronic instruments shown in FIGS. 12 to 14 comprise the color filter of the above-described embodiment, images can be preferably displayed, the manufacturing cost can be reduced, and the manufacturing period can be shortened.

Note that the technical range of the invention is not limited to the above-described embodiments, and various changes can be made without departing from the scope of the invention. The specific materials and the layer structures described in the embodiments are just a few examples and appropriate changes can be made.

For example, in the above-described embodiments, the manufacturing method of a color filter that is one type of optical element is described, however, the fine structure manufacturing method according to the invention can be used when forming other optical components or wirings of integrated circuits. Further, electronic elements such as a resistance of an integrated circuit, a capacitor, a transistor, a diode, and a semiconductor laser may be manufactured by using the invention.

In addition, in the above-described embodiments, the liquid-repellent film 12 is eliminated with respect to the whole area in which a pattern is to be formed, however, the elimination may be performed with respect to a boundary part of the area where the pattern is to be formed in the liquid-repellent film. Concurrently, the lyophilic film 11 may also eliminated with respect to the boundary part of the area where the pattern is to be formed in the liquid-repellent film. Then, liquid material may be filled in the area where the liquid-repellent film (and lyophilic film) has been eliminated, and an area surrounded by the area to form a desired pattern. Thereby, the holding force on the liquid material can be further improved.

Further, the invention can be applied to a metal wiring pattern formation when coating liquid form including metal fine particles on a surface of a member to form metal wiring.

As clearly seen by the above description, according to the invention, since a liquid-repellent film is provided on a first film and a part of a desired pattern in the liquid-repellent film is eliminated, the desired pattern can preferably be formed at high speed when forming the desired pattern by using liquid material.

The entire disclosure of Japanese Patent Application No. 2002-294878 filed Oct. 8, 2002 is incorporated by reference.

What is claimed is:

1. A fine structure manufacturing method for forming a pattern on a member comprising the steps of:
   providing a first film on a treated surface of the member;
   providing a liquid-repellent film on an upper surface of the first film, the liquid-repellent film having liquid repellency to a liquid material to be applied to the pattern;
   eliminating part of the liquid-repellent film which corresponds to an area where the pattern is to be formed:
   filling in the area where the liquid-repellent film is eliminated with the liquid material; and
   at least one of drying and baking the liquid material to form the pattern on the area where the liquid material is filled.

2. The fine structure manufacturing method according to claim 1, wherein the first film is a lyophilic film having a lyophilic property relative to the liquid material.

3. The fine structure manufacturing method according to claim 1, wherein the liquid-repellent film comprises an activated film activated or volatilized by being irradiated with an electromagnetic wave.

4. The fine structure manufacturing method according to claim 1, further comprising a step of eliminating a portion of the first film corresponding to the area where the pattern is to be formed, after eliminating the liquid-repellent film.

5. The fine structure manufacturing method according to claim 4, wherein elimination of the first film is performed by irradiation with an electromagnetic wave.

6. A fine structure manufacturing method comprising the steps of:
   providing a first film on a treated surface;
   providing a liquid-repellent film on an upper surface of the first film, the liquid-repellent film having liquid repellency to a liquid material:
   eliminating the liquid-repellent film at a boundary of an area where a pattern is to be formed; and
   filling in the area where the liquid-repellent film is eliminated with the liquid material.

7. The fine structure manufacturing method according to claim 6, further comprising a step of eliminating the first film at the boundary of the area where the pattern is to be formed.

8. A fine structure manufacturing method for forming a pattern on a member comprising the steps of:
   providing a lyophilic film on a treated surface of the member, the lyophilic film having a lyophilic property relative to a liquid material employed for forming the pattern;
   providing a decomposition acceleration layer on an upper surface of the lyophilic film, the decomposition acceleration layer accelerating a decomposition of a liquid-repellent film, the liquid-repellent film having liquid repellency relative to the liquid material;
   providing the liquid-repellent film on an upper surface of the decomposition acceleration layer;
   eliminating part of the liquid-repellent film which is located on an area where the pattern is to be formed:
   filling in the area where the liquid-repellent film is eliminated with the liquid material; and at least one of drying and baking the liquid material to form the pattern on the area where the liquid material is filled.

9. The fine structure manufacturing method according to claim 8, wherein elimination of the liquid-repellent film further comprises irradiating the area where the pattern is to be formed in the liquid-repellent film with an electromagnetic wave.

* * * * *